(12) United States Patent
Hisa et al.

(10) Patent No.: US 7,653,107 B2
(45) Date of Patent: Jan. 26, 2010

(54) SEMICONDUCTOR LIGHT-EMITTING DEVICE

(75) Inventors: Yoshihiro Hisa, Tokyo (JP); Tsutomu Yamaguchi, Tokyo (JP); Takehiro Nishida, Tokyo (JP); Kenji Hiramatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/104,756

(22) Filed: Apr. 17, 2008

(65) Prior Publication Data

US 2009/0022197 A1    Jan. 22, 2009

(30) Foreign Application Priority Data

Jul. 17, 2007    (JP) ............................... 2007-185614

(51) Int. Cl.
*H01S 5/00* (2006.01)
(52) U.S. Cl. .................................. 372/49.01; 372/46.01
(58) Field of Classification Search .................... 257/80; 372/46.01, 36; 174/255
See application file for complete search history.

(56) References Cited

U.S. PATENT DOCUMENTS

| | | | | |
|---|---|---|---|---|
| 5,500,869 A | * | 3/1996 | Yoshida et al. | 372/50.23 |
| 6,404,792 B1 | * | 6/2002 | Yamamoto et al. | 372/46.01 |
| 6,583,510 B2 | | 6/2003 | Hanamaki et al. | |
| 6,761,303 B2 | * | 7/2004 | Ozawa | 228/123.1 |
| 6,925,100 B2 | * | 8/2005 | Senda et al. | 372/36 |
| 7,436,868 B2 | * | 10/2008 | Schulte et al. | 372/36 |
| 2004/0008744 A1 | * | 1/2004 | Okazaki et al. | 372/36 |

FOREIGN PATENT DOCUMENTS

| | | |
|---|---|---|
| JP | 10-8288 | 1/1998 |
| JP | 2002-246333 | 8/2002 |

* cited by examiner

*Primary Examiner*—Minsun Harvey
*Assistant Examiner*—Tuan N. Nguyen
(74) *Attorney, Agent, or Firm*—Leydig, Voit & Mayer, Ltd.

(57) ABSTRACT

Semiconductor laser elements are formed on a common substrate. Au plating is formed on principal surfaces of the semiconductor laser elements. The semiconductor laser elements are mounted on a package with solder applied to the Au plating. Areas opposed to each other across a light-emitting area of each semiconductor laser element are designated first and second areas. Average thickness of the Au plating is different in the first and second areas of each semiconductor laser element.

2 Claims, 6 Drawing Sheets polarization characteristics of output beam polarization characteristics of output beam light-emitting area are polarization characteristics of output beam polarization characteristics of output beam polarization characteristics of output beam

SEMICONDUCTOR LIGHT-EMITTING DEVICE

BACKGROUND OF THE INVENTION

1. Field of the Invention

The present invention relates to a semiconductor light-emitting device which includes a plurality of semiconductor laser elements formed on the same substrate and is mounted on a package using solder, and a manufacturing method thereof, and more particularly, to a semiconductor light-emitting device and a manufacturing method thereof capable of preventing polarized light of each semiconductor laser element from rotating before and after mounting on the package.

2. Background Art

As a recording speed multiplication factor increases, light output required for a recording type high-output laser diode is increasing in an accelerating pace. Furthermore, it is important to obtain a stable light beam polarization characteristics so as to efficiently input the light output to an optical system. When the polarization characteristics is not stable, the efficiency of injecting light into the optical system declines, requiring a greater amount of light output.

Since solder is used to mount a semiconductor laser element on a package, the temperature at the time of mounting needs to be set to as high as 300° C. or more. Therefore, residual stress remains at an operating temperature of 100° C. or below due to a difference in the linear expansion coefficient between the semiconductor laser element and the package.

FIG. 15 is a perspective view showing a conventional semiconductor light-emitting device with one semiconductor laser element formed on a substrate (e.g., see Japanese Patent Laid-Open No. 2002-246333). One semiconductor laser element 10 is formed on a GaAs substrate 11. Furthermore, Au plating 16 is formed on the principal surface of the semiconductor laser element 10. Solder 18 is applied to the Au plating 16 and a plurality of semiconductor laser elements 10 are mounted on a submount 19 using this solder 18. The submount 19 is mounted on a package 22 using solder 21.

Here, the linear expansion coefficient of GaAs which is the material of the GaAs substrate 11 is $6 \times 10^{-6}/°$ C.). On the other hand, the linear expansion coefficient of Fe often used as the material of the package 22 is 11. Furthermore, the linear expansion coefficient of Cu often used as the material of the high radiation package 22 is 17. Directly mounting the semiconductor laser element 10 on the Fe package 22 using the solder 18 may cause the semiconductor laser element 10 to be destroyed by residual stress produced due to a difference in the linear expansion coefficient. When the Cu package 22 is used, the difference in the linear expansion coefficient further increases and the residual stress also increases.

Therefore, to reduce the influence of this residual stress, the submount 19 made of AlN having a linear expansion coefficient of 4 is inserted between the package 22 and the semiconductor laser element 10. The linear expansion coefficient of the submount 19 is approximate to that of the GaAs substrate 11 and its mechanical intensity is also large, and therefore residual stress can be reduced. However, even this structure cannot reduce the residual stress to 0.

When only one semiconductor laser element 10 is formed on the GaAs substrate 11, the residual stress after assembly applies to the left and right sides of the light emitting area of the semiconductor laser element 10 symmetrically. Therefore, rotation of polarized light does not occur compared to before the assembly.

SUMMARY OF THE INVENTION

However, as shown in FIG. 16, when a plurality of semiconductor laser elements 10a, 10b are formed on the same substrate 11, residual stress which applies to the semiconductor laser elements 10a, 10b is not always symmetrical. Therefore, rotation of polarized light occurs compared to before the assembly. This rotation of polarized light varies every time the outgoing beam power of the semiconductor laser elements 10a, 10b changes, that is, every time the element temperature during operation changes. Therefore, when a polarization filter is used for the optical system, the efficiency of light injection into the optical system varies every time the rotation angle of the polarized light changes and there is a problem that stable light power cannot be obtained as a pickup.

The present invention has been implemented to solve the above described problems and it is an object of the present invention to provide a semiconductor light-emitting device and a manufacturing method thereof capable of preventing polarized light of each semiconductor laser element from rotating before and after mounting on a package.

According to one aspect of the present invention, a semiconductor light-emitting device comprises: a plurality of semiconductor laser elements formed on the same substrate; Au plating formed on principal surfaces of the plurality of semiconductor laser elements; and a package on which the plurality of semiconductor laser elements are mounted using solder applied to the Au plating, wherein areas opposed to each other across a light-emitting area of each semiconductor laser element are designated as a first area and a second area, and an average thickness of the Au plating is made nonuniform between the first area and the second area of each semiconductor laser element.

According to another aspect of the present invention, a method of manufacturing a semiconductor light-emitting device, comprising: a step of forming a plurality of semiconductor laser elements on the same substrate; a step of forming Au plating on principal surfaces of the plurality of semiconductor laser elements; and a step of applying solder to the Au plating and mounting the plurality of semiconductor laser elements on a package using the solder, wherein areas opposed to each other across a light-emitting area of each semiconductor laser element are designated as a first area and a second area, and an average thickness of the Au plating is made nonuniform between the first area and the second area of each semiconductor laser element.

The present invention can prevent polarized light of each semiconductor laser element from rotating before and after mounting on a package.

Other and further objects, features and advantages of the invention will appear more fully from the following description.

DETAILED DESCRIPTION OF THE PREFERRED EMBODIMENTS

Embodiment 1

Figure 1:
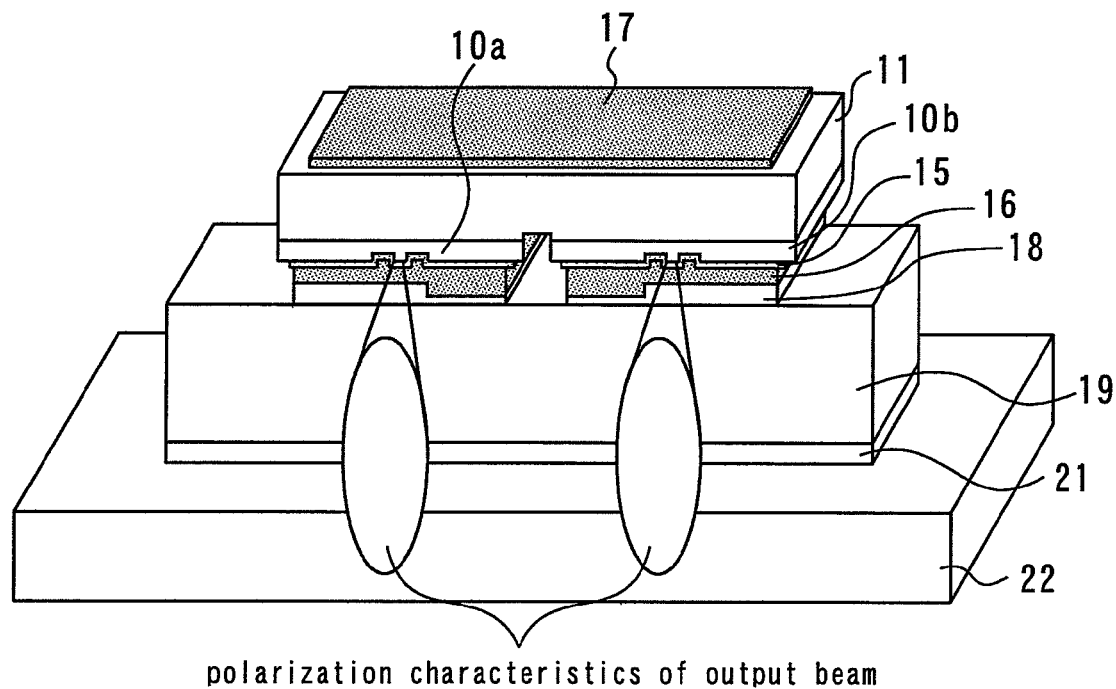
FIG. 1 is a perspective view showing a semiconductor light-emitting device according to Embodiment 1 of the present invention.
Figure 2:
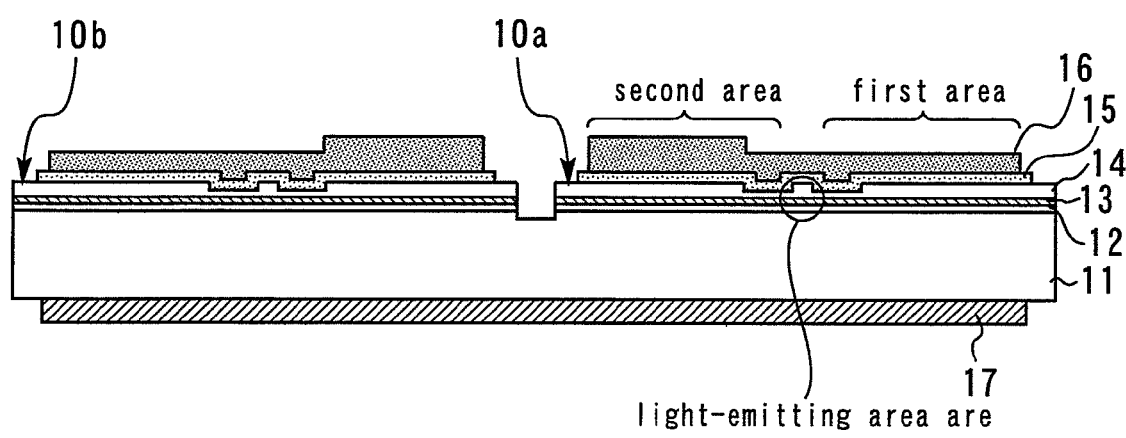
FIG. 2 is a cross-sectional view showing a plurality of semiconductor laser elements according to Embodiment 1 of the present invention.

FIG. 1 is a perspective view showing a semiconductor light-emitting device according to Embodiment 1 of the present invention. Furthermore, FIG. 2 is a cross-sectional view showing a plurality of semiconductor laser elements according to Embodiment 1 of the present invention.

A plurality of semiconductor laser elements 10a, 10b are formed on the same GaAs substrate 11 (substrate). Each semiconductor laser element 10a, 10b has an n-type semiconductor layer 12, an activated layer 13 and a p-type semiconductor layer 14 formed in that order on the principal surface of the n-type GaAs substrate 11. Furthermore, an electrode pattern 15 and Au plating 16 are formed in that order on the principal surface of each semiconductor laser element 10a, 10b. A back electrode 17 is formed on the back of the GaAs substrate 11. The plurality of semiconductor laser elements 10a, 10b are mounted on a submount 19 using solder 18 applied to the Au plating 16. The submount 19 is mounted on the package 22 using solder 21.

A light-emitting area is formed in the center of each semiconductor laser element 10a, 10b. Suppose areas opposed to each other across the light-emitting area are a first area and a second area. Here, the first area is closer to the outside of the GaAs substrate 11 and the second area is closer to the central part. The thickness of the Au plating 16 is reduced to approximately 2 μm in the first area and increased to 3 μm in the second area.

Figure 3:
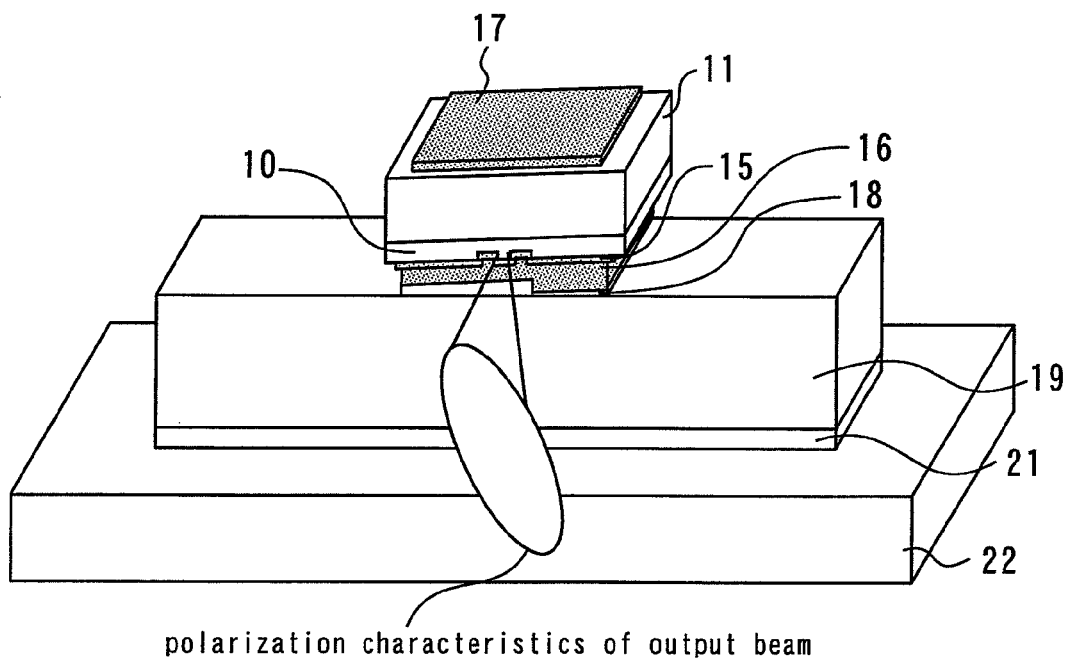
FIG. 3 is a perspective view showing a semiconductor light-emitting device with one semiconductor laser element formed on a substrate and an average thickness of the Au plating made nonuniform.
Figure 16:
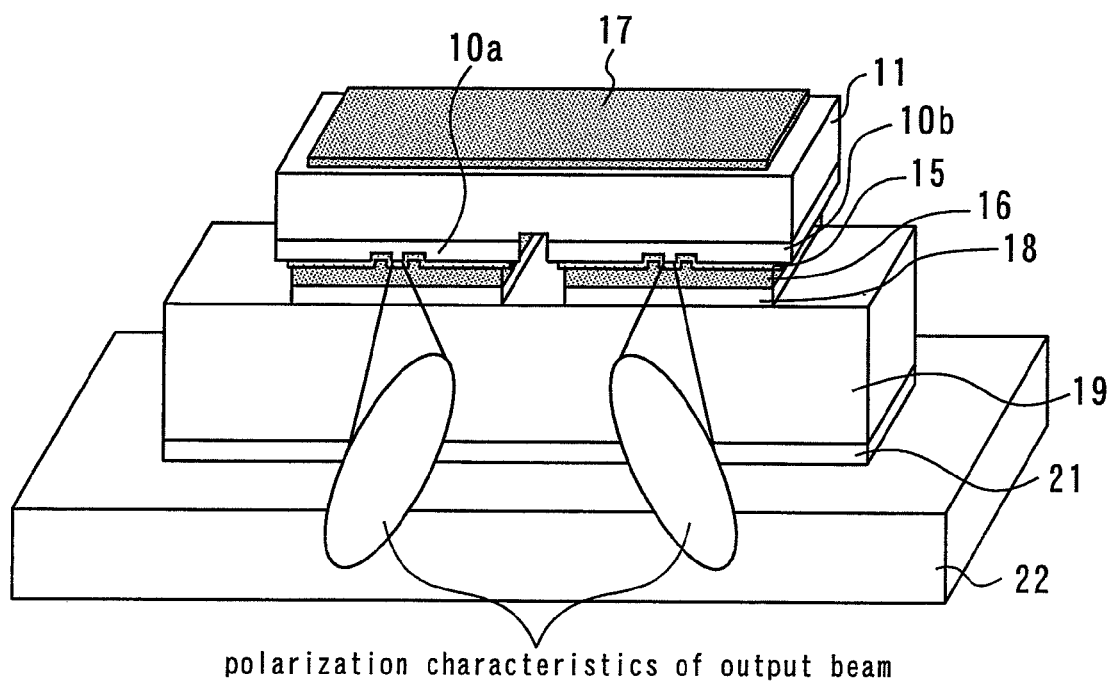
FIG. 16 is a perspective view showing a conventional semiconductor light-emitting device with a plurality of semiconductor laser elements formed on the same substrate.

As an experiment here, as shown in FIG. 3, one semiconductor laser element 10 was formed on the GaAs substrate 11 and the thickness of the Au plating 16 was decreased in the left-half area and increased in the right-half area. It was then observed polarized light of the semiconductor laser element 10 went around the thinner area of the Au plating 16. According to this characteristic, by increasing the thickness of the Au plating 16 closer to the central part of the GaAs substrate 11, it is possible to prevent rotation of polarized light produced in the conventional semiconductor light-emitting element with the Au plating 16 shown in FIG. 16 having a uniform thickness.

Next, the method of manufacturing the semiconductor light-emitting device according to Embodiment 1 of the present invention will be explained with reference to drawings. However, for simplicity of explanation, only one semiconductor laser element 10a will be illustrated.

Figure 4:
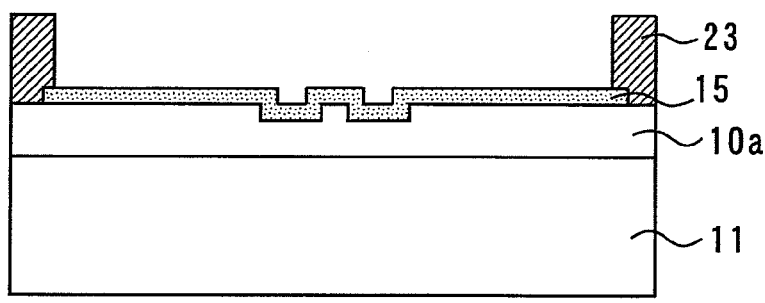
FIGS. 4-7 are sectional views for explaining a method of manufacturing a semiconductor light-emitting device according to Embodiment 1 of the present invention.

First, a plurality of semiconductor laser elements 10a, 10b are formed on the same GaAs substrate 11. As shown in FIG. 4, an electrode pattern 15 is formed on the principal surface of each semiconductor laser element 10a, 10b. Furthermore, a mask pattern for plating 23 is formed on the electrode pattern 15.

Figure 5:
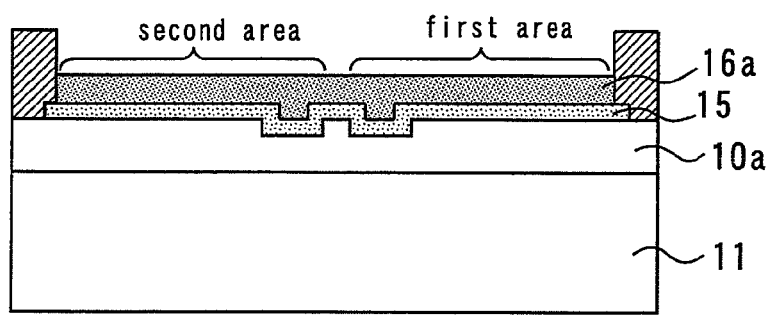

Next, as shown in FIG. 5, a current for plating is supplied to the electrode pattern 15 and first Au plating 16a is formed in the first area and the second area of each semiconductor laser element 10a, 10b. After that, the mask pattern for plating 23 is removed.

Figure 6:
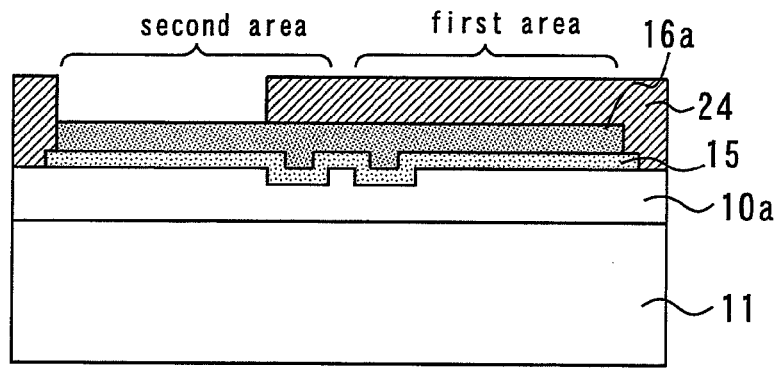
Figure 7:
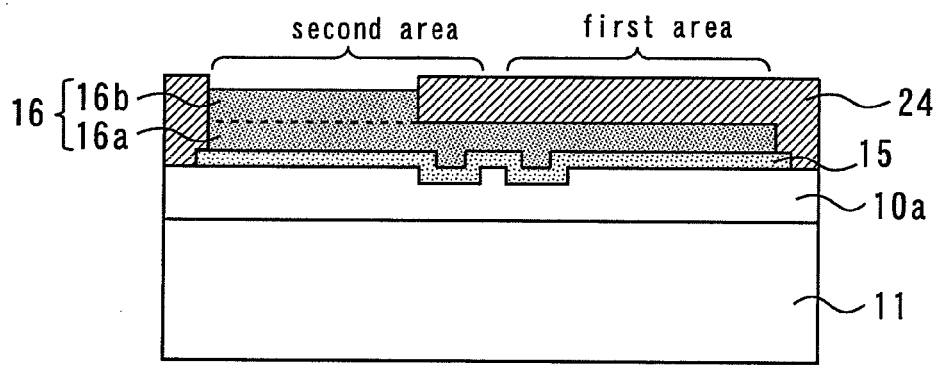

Next, as shown in FIG. 6, a mask pattern for plating 24 is formed so as to cover the first area of each semiconductor laser element 10a, 10b. Next, as shown in FIG. 7, a current for plating is supplied to the electrode pattern 15 and second Au plating 16b is formed in the second area. In this way, Au plating 16 made up of the first Au plating 16a and the second Au plating 16b is formed on the principal surfaces of the semiconductor laser elements 10a, 10b.

Using this method, the average thickness of the Au plating 16 in the first area and the second area can be made nonuniform. Furthermore, since the mask pattern for plating needs to be formed twice, this method takes more time and trouble but it is possible to accurately control the thickness of the Au plating 16.

After that, a back electrode 17 is formed on the back of the GaAs substrate 11. Solder 18 is then applied to the Au plating 16 and the plurality of the semiconductor laser elements 10a, 10b are mounted on the submount 19 using this solder 18. Furthermore, the submount 19 is mounted on the package 22 using solder 21. In this way, the semiconductor light-emitting device as shown in FIG. 1 is manufactured As explained above, the semiconductor light-emitting apparatus according to this embodiment makes nonuniform the average thickness of the Au plating 16 in the first area and the second area of each semiconductor laser element 10a, 10b, and can thereby prevent polarized light of each semiconductor laser element 10a, 10b from rotating before and after mounting on the package 22.

In the case where the above described materials are used, the assembly temperature is 350° C., the length of the semiconductor laser elements 10a, 10b is 1.5 mm or more, the width is on the order of 200 μm, tensile stress is applied to the activated layer 13 in the vertical direction. Simply judging from the linear expansion coefficient difference, compression stress seems to apply to the semiconductor laser elements 10a, 10b, but due to the elongated structure of the semiconductor laser element 10a, 10b and the existence of the submount 19, residual stress after assembly becomes complicated, compression stress applies in the longitudinal direction parallel to the activated layer 13 but tensile stress applies in the vertical direction. However, when compression stress applies in the direction perpendicular to the activated layer 13 depending on the shape of the semiconductor laser elements 10a, 10b, the Au plating 16 may be made thinner in the area closer to the central part of the GaAs substrate 11. Furthermore, in the above described example, the thickness of the Au plating 16 is changed for both the semiconductor laser elements 10a, 10b, but the thickness of the Au plating 16 may also be changed for only one of the semiconductor laser elements depending on residual stress.

Furthermore, in a simulation of ANSYS or the like, it is not possible to confirm from a small difference in the thickness of the Au plating 16 that residual stress can be reduced. Therefore, the present invention cannot be easily guessed using the current simulation technology.

Embodiment 2

A method of manufacturing a semiconductor light-emitting device according to Embodiment 2 of the present invention will be explained with reference to drawings. However, for simplify of explanation, only one semiconductor laser element 10a will be illustrated. Furthermore, since processes other than the plating process are the same as those in Embodiment 1, explanations thereof will be omitted.

Figure 8:
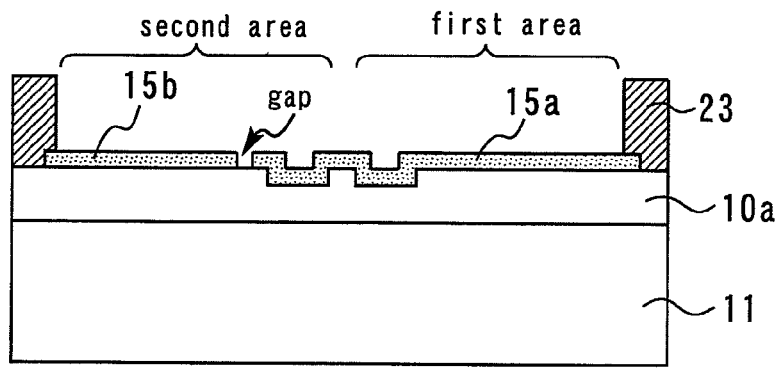
FIGS. 8-10 are sectional views for explaining a method of manufacturing a semiconductor light-emitting device according to Embodiment 2 of the present invention.

First, as shown in FIG. 8, a first electrode pattern 15a and a second electrode pattern 15b are formed in a first area and a second area of the principal surface of each semiconductor laser element 10a, 10b respectively. However, a gap on the order of 2 μm is provided between the first electrode pattern 15a and the second electrode pattern 15b to electrically separate the two patterns apart. Furthermore, mask patterns for plating 23 are formed on the first and second electrode patterns 15a, 15b.

Figure 9:
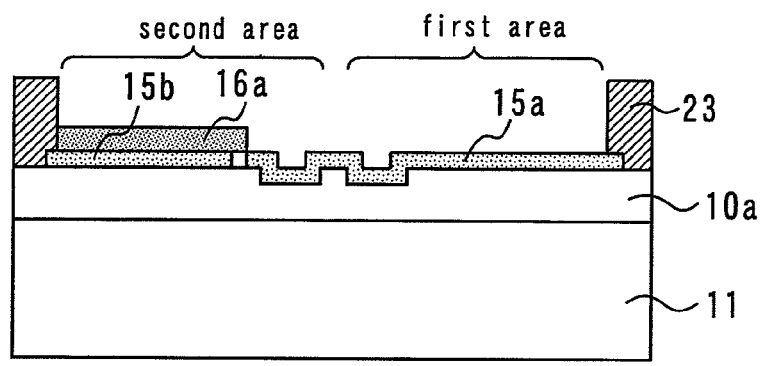

Next, as shown in FIG. 9, a current for plating is supplied to only the second electrode pattern 15b and first Au plating 16a is formed in the second area. Since plating advances in the horizontal direction, too, the first Au plating 16a covers the gap.

Figure 10:
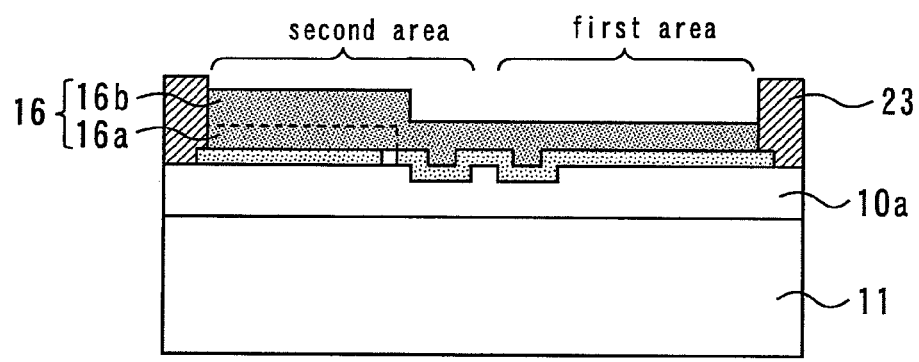

Next, as shown in FIG. 10, a current for plating is supplied to the first electrode pattern 15a and the second electrode pattern 15b and second Au plating 16b is formed in the first area and the second area. In this way, Au plating 16 made up of the first Au plating 16a and the second Au plating 16b is formed on the principal surface of the semiconductor laser elements 10a, 10b.

Using this method allows the average thickness of the Au plating 16 to be made nonuniform in the first area and the second area through one plating process, and can thereby reduce the manufacturing cost. However, since the thickness of the Au plating 16 is likely to vary, this method needs to be used for such an element structure that the variation in thickness of the Au plating 16 does not significantly influence rotation of polarization.

Embodiment 3

A method of manufacturing a semiconductor light-emitting device according to Embodiment 3 of the present invention will be explained with reference to drawings. However, for simplify of explanation, only one semiconductor laser element 10a will be illustrated. Furthermore, since processes other than the plating process are the same as those in Embodiment 1, explanations thereof will be omitted.

Figure 11:
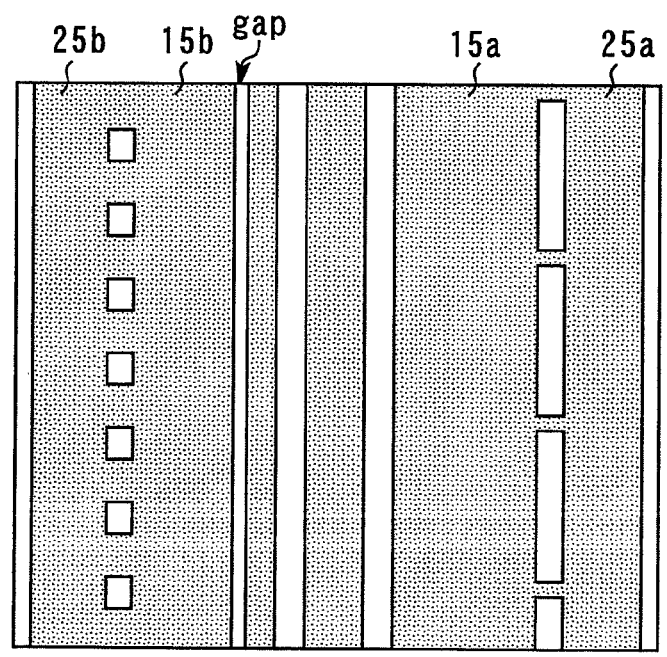
FIGS. 11-13 are sectional views for explaining a method of manufacturing a semiconductor light-emitting device according to Embodiment 3 of the present invention.
Figure 12:
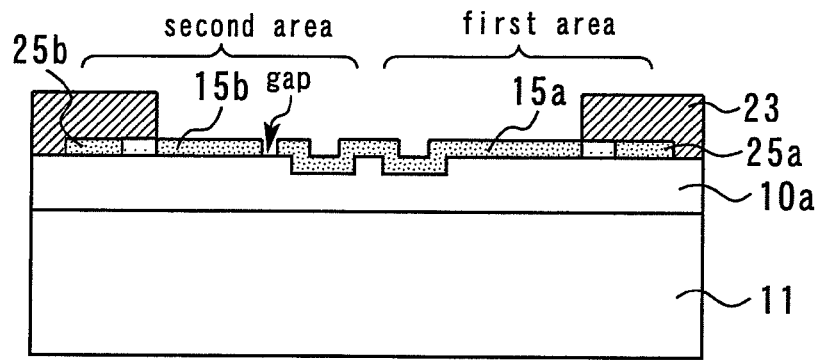

First, as shown in a top view in FIG. 11 and a cross-sectional view in FIG. 12, a first electrode pattern 15a and a second electrode pattern 15b are formed in a first area and a second area of the principal surface of each semiconductor laser element 10a, 10b. However, a gap on the order of 3 μm is provided between the first electrode pattern 15a and the second electrode pattern 15b to electrically separate the two patterns apart. Furthermore, auxiliary electrodes 25a, 25b for supplying a current for plating are connected to the first and second electrode patterns 15a, 15b. Mask patterns for plating 23 are then formed on the first and second electrode patterns 15a, 15b. Here, the width of the pattern connecting the second electrode pattern 15b and the auxiliary electrode 25b is made greater than the width of the pattern connecting the first electrode pattern 15a and the auxiliary electrode 25a to provide a difference in electric resistance. In this way, even if a current of the same magnitude is supplied to the auxiliary electrodes 25a, 25b, currents of different current values are supplied to the first electrode pattern 15a and the second electrode pattern 15b.

Figure 13:
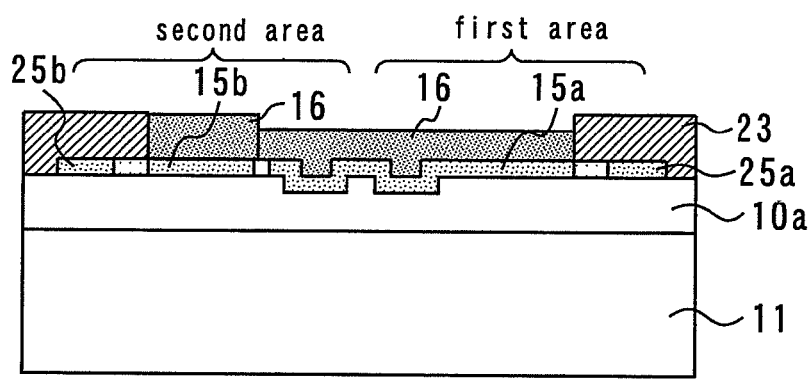

Next, as shown in FIG. 13, a current for plating is supplied to the first electrode pattern 15a and the second electrode pattern 15b through the auxiliary electrodes 25a, 25b and Au plating 16 is formed in the first area and the second area. In this case, since the electric resistance of the pattern connecting the second electrode pattern 15b and the auxiliary electrode 25b is lower, plating advances faster on the second electrode pattern 15b and the Au plating 16 becomes thicker in the second area.

Forming the Au plating 16 using this method can make the average thickness of the Au plating 16 nonuniform in the first area and the second area through one plating process. Furthermore, the difference in thickness of the Au plating 16 can be easily controlled. However, spaces for providing the auxiliary electrodes 25a, 25b need to be secured. Moreover, if the current values supplied to the auxiliary electrodes 25a, 25b can be changed, there will be no necessity for providing a difference in electric resistance of patterns for connecting the first and second electrode patterns 15a, 15b with the auxiliary electrodes 25a, 25b respectively.

Embodiment 4

Figure 14:
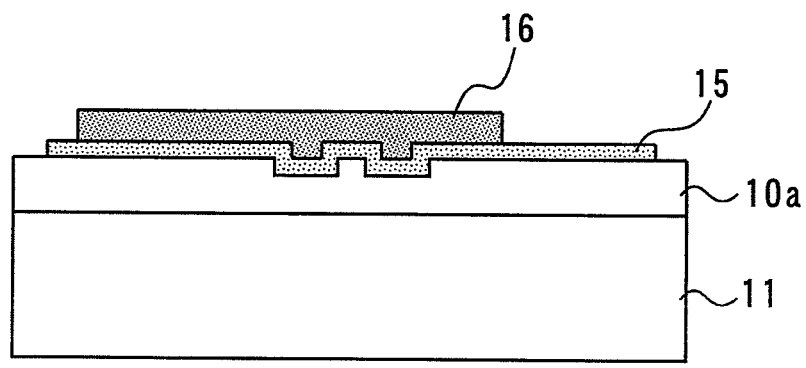
FIG. 14 are sectional views for explaining a method of manufacturing a semiconductor light-emitting device according to Embodiment 4 of the present invention.
Figure 15:
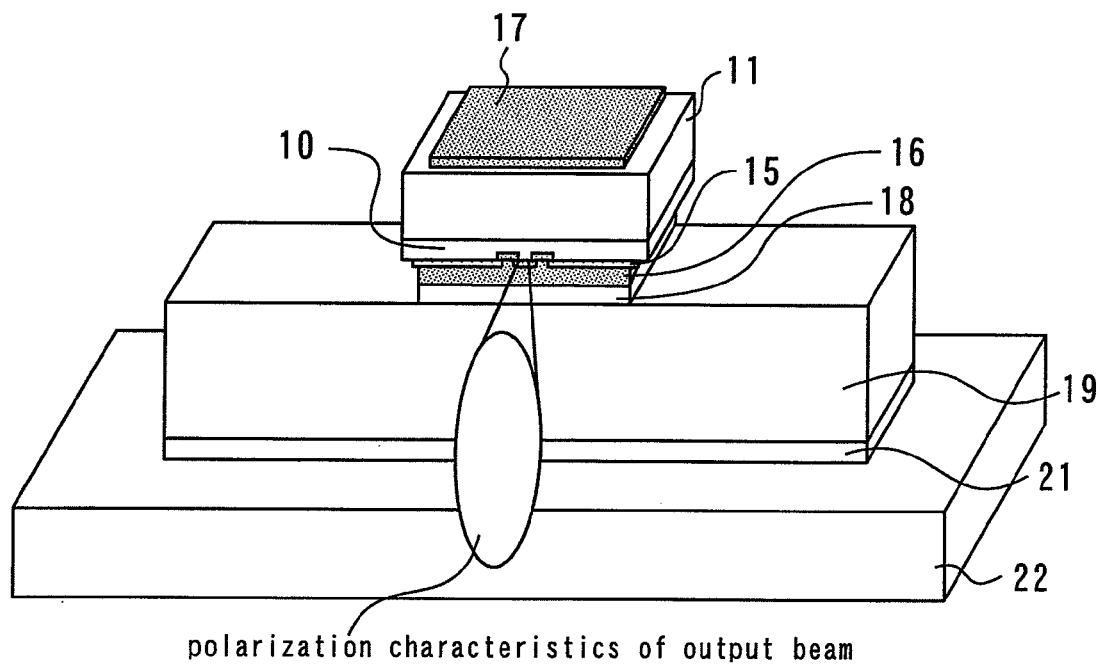
FIG. 15 is a perspective view showing a conventional semiconductor light-emitting device with one semiconductor laser element formed on a substrate.

As shown in FIG. 14, Embodiment 4 of the present invention equalizes the thickness of Au plating 16 between the first area and the second area of each semiconductor laser element and makes nonuniform the formation area of the Au plating 16 between the first area and the second area. Here, the Au plating 16 is formed substantially the entire surface of the second area and the Au plating 16 is formed only for the area approximately half the area of the first area. When the principal surfaces of a plurality of semiconductor laser elements 10a, 10b are mounted on a submount 19 using solder 18, such a condition is set that the solder 18 and Au plating 16 are mixed well and spread uniformly on the electrode pattern 15. The other processes are the same as those in Embodiment 1. In this way, it is possible to make nonuniform the thickness of the Au plating 16 alloyed with the solder 18 after assembly between the first area and the second area, and thereby exert the same effect as that in Embodiment 1.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-185614, filed on Jul. 17, 2007 including specification, claims, drawings and summary, on which the Convention priority of the present application is based, are incorporated herein by reference in its entirety.

What is claimed is:

1. A semiconductor light-emitting device comprising:
   first and second semiconductor laser elements disposed on a common substrate, the first and second semiconductor lasers having a plurality of semiconductor layers disposed on the common substrate and respective spaced-apart light-emitting areas;
   Au plating on principal surfaces of the first and second semiconductor laser elements; and a submount on which the first and second semiconductor laser elements are mounted with solder interposed between and contacting the Au plating and the submount, wherein each of the first and second semiconductor elements includes, on opposite sides of the respective light-emitting areas, a first area and a second area, average thickness of the Au plating is different in the first area and in the second area of each of the first and second semiconductor laser elements, and separation between the first areas of the first and second semiconductor laser elements is smaller than separation between the second areas of the first and second semiconductor laser elements.

2. The semiconductor laser emitting device according to claim 1, wherein the average thickness of the Au plating is larger in the first area than in the second area of each of the first and second semiconductor laser elements.

* * * * *